Oct. 27, 1964 G. L. SCHNABLE 3,154,437

METHOD FOR INTRODUCING AN ACTIVATOR IMPURITY SUBSTANCE INTO A PORTION OF A BODY OF CRYSTALLINE SEMICONDUCTIVE MATERIAL AND FOR BONDING A LEAD MEMBER TO SAID PORTION

Filed Jan. 17, 1961

INVENTOR.
GEORGE L. SCHNABLE
BY
Albert L. Free
AGENT

United States Patent Office 3,154,437
Patented Oct. 27, 1964

3,154,437
METHOD FOR INTRODUCING AN ACTIVATOR IMPURITY SUBSTANCE INTO A PORTION OF A BODY OF CRYSTALLINE SEMICONDUCTIVE MATERIAL AND FOR BONDING A LEAD MEMBER TO SAID PORTION

George L. Schnable, Lansdale, Pa., assignor, by mesne assignments, to Philco Corporation, Philadelphia, Pa., a corporation of Delaware Filed Jan. 17, 1961, Ser. No. 83,343
11 Claims. (Cl. 148—1.5)

This invention relates to methods for fabrication of semiconductor devices and especially to methods for the introduction of impurity substances into predetermined regions of semiconductive bodies and for the bonding of electrical connections to said regions.

In the art of fabricating semiconductor devices such as transistors it is often necessary to disperse atoms of a conductivity-affecting impurity into a prescribed region of a semiconductive body and to provide an electrical connection to said region. For example in making a PNP alloy-junction transistor an impurity metal of the type to impart P-type characteristics to the semiconductive body is alloyed into opposite sides of an N-type base wafer to form opposed P-type regions in the body, the PN junctions between the P- and N-type regions serving as emitter and collector elements of a transistor. Wires are secured to the two P-type regions to serve as emitter and collector leads. In addition, an ohmic base connection is commonly made to such devices by soldering a metal base connector to the base semiconductive material with a solder consisting of substances which when alloyed with the base material tend to produce the same type of conductivity as already exists in the base—e.g. the solder may consist of N-type dopant materials when the base is of N-type semiconductive material.

Especially in commercial production of such semiconductor devices it is highly advantageous to perform such alloying and lead connection as quickly and simply as possible. Particularly where the alloyed region is to be small and accurately located, as for the emitter and collector regions of certain transistors designed for operation at extremely high frequencies, it has been difficult to form the alloyed region in exactly the desired locations and with exactly the desired characteristics and to make suitable connections to these regions without damaging their electrical characteristics. One method which has been used successfully for this purpose is described in U.S. Patent No. 2,930,108 of Richard A. Williams, issued March 29, 1960 and entitled "Method for Fabricating Semiconductive Devices," in which method the emitter of a so-called micro-alloy transistor is formed by electroplating a tiny dot of metal upon one side of a thin region of N-type semiconductive base material, electroplating onto the end of a filamentary lead member a globule of solder containing a strong P-type dopant, positioning the wire so that the globule bears against the metal emitter dot, and briefly heating the assembly to cause the solder to melt, to dissolve the emitter dot and some of the underlying semiconductor material, and thereby to introduce the P-type activating material into the semiconductor. After cooling and resultant recrystallization of the alloyed semiconductor a region of P-type conductivity is present beneath the emitter connection, the lateral extent of this region being determined by the periphery of the original metal dot. At the same time the metal lead is firmly soldered to the emitter region so as to provide a suitable emitter connection.

While this method has proved extremely successful in many applications, there are other applications in which it is difficult or impossible to use the method to obtain the desired alloying and lead connection. For example in certain cases the electrical properties of the semiconductor device will be improved if the impurity metal or dopant is of a particular type which, however, it is impossible or impracticable to plate upon the end of the filamentary lead member by known electroplating procedures in a manner suitable for use in the process. Furthermore it is advantageous in commercial production to electroplate the solder and dopant material simultaneously upon the lead member, and even where the dopant can be plated by itself it may not be possible to plate it properly along with the solder material. Aluminum is an example of a dopant material which if properly introduced into a germanium semiconductive body to form a P-type emitter will produce exceptionally fine electrical characteristics, but which cannot conveniently be electroplated in the desired manner upon the end of the lead member prior to alloying. Other possible dopant materials, such as arsenic and antimony, are highly volatile and hence are inconvenient or impractical for use in such a process. Similar problems arise in the making of ohmic base connections to semiconductive bodies, particularly when the connection must be small and accurately located as in the fabrication of certain high frequency mesa-type transistors for example.

Accordingly it is an object of the invention to provide a novel method for the introduction of a conductivity-affecting impurity substance into a region of a semiconductive body and for providing an external connection to said region of said body.

Another object is to provide an improved method for simultaneously forming an impurity-activated region in a semiconductive body and bonding a solid connection to said region.

A further object is to provide an improved method for alloying an activator material with a plated metal contact on a semiconductive body to form an impurity-activated region in the semiconductive body beneath the original plated metal, and for fastening an external lead to said region.

It is another object to provide a novel method for forming a rectifying connection to a semiconductive body and for affixing a lead thereto.

Still another object is to provide a novel method for forming a minority-carrier emissive connection to a semiconductive body and bonding a lead thereto.

In accordance with the invention the above objects are achieved by including an activator impurity substance in at least a portion of the lead member to be bonded to the semiconductive body and applying to said portion of said lead member a solder substance which dissolves some of the impurity from the lead member to produce an agglomerate in which said impurity substance is present. This agglomerate is applied to the region of the semiconductive body to be activated, at a temperature at which the agglomerate dissolves the adjacent semiconductive material and mixes therewith, so that upon subsequent cooling and recrystallization the activating impurity substance from the lead member is present in the semiconductive material and modifies the electrical characteristics thereof. In addition, during solidification of the agglomerate the lead member is maintained with a portion thereof extending into the liquid agglomerate so that said lead member is bonded to the activated region by the solidified material.

In one particularly advantageous application of the invention to forming the emitter of a transistor device the lead member is a wire containing the activating impurity substance as an alloy constituent and there is electroplated upon the end of the wire a molten globule which dissolves some of the impurity substance from the wire. After the globule has been allowed to solidify the lead is positioned so that the globule abuts a metal emitter dot which has been electroplated upon a semiconductive body, and the solder is heated briefly to melt it momentarily, to dissolve more of the impurity from the end of the wire and at the same time to dissolve the metal dot and some of the underlying semiconductive material. In this way the impurity material is introduced into the semiconductive material, and upon subsequent cooling and recrystallization provides a suitably doped, extremely thin emitter region. At the same time the solidified mass of metal forms a firm bond between the end of the lead wire and the emitter region.

Other objects and features of the invention will be more readily appreciated from a consideration of the following detailed description taken in connection with the accompanying drawings in which.

For convenience in exposition the invention will first be described by way of example as it may be applied in making the so-called micro-alloy type of high-frequency transistor described and claimed in U.S. Patent No. 2,870,052 of A. D. Rittmann, filed May 18, 1956, issued January 20, 1959, and entitled Semiconductive Device and Method for the Fabrication Thereof. This transistor typically comprises a semiconductive wafer of N-type germanium having an ohmically-affixed base connection to the wafer, a pair of opposed pits, circular metal contacts concentrically aligned with each other on the opposed bottom surfaces of the pits to form an emitter and a collector contact, and an extremely thin region of P-type semiconductor under the emitter contact; wire leads are fastened to the emitter and collector contacts.

Figures 1, 2, 3:
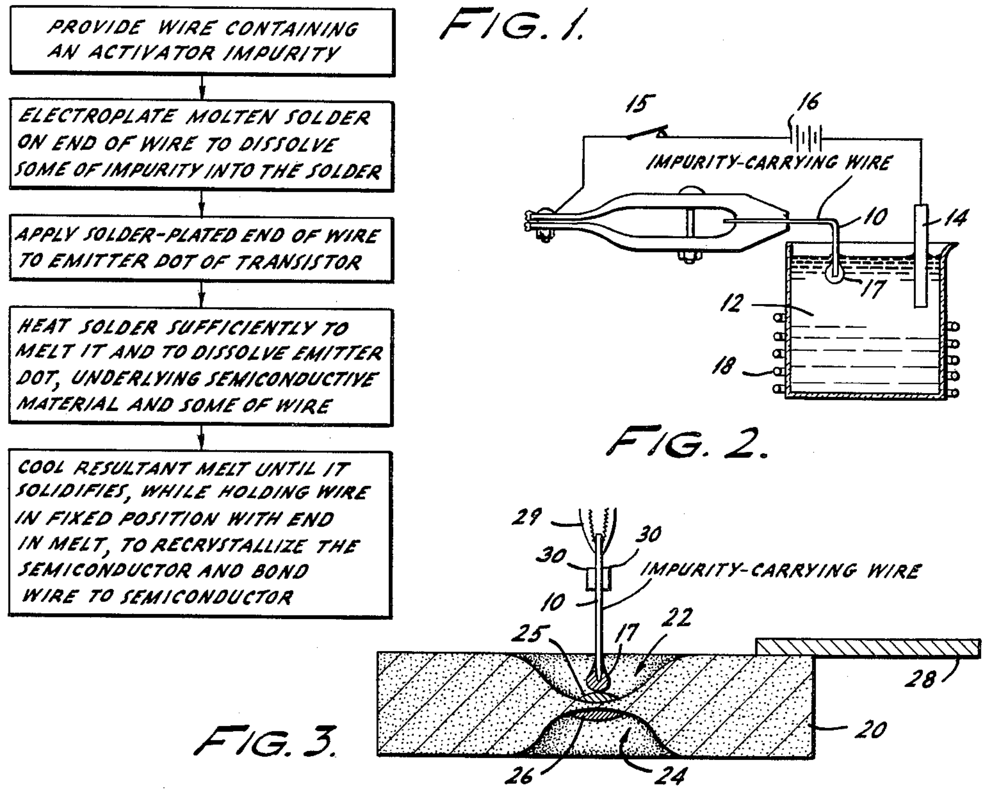
FIGURE 1 is a flow diagram showing a sequence of steps employed in a preferred embodiment of the invention.
FIGURE 2 is a schematic representation illustrating apparatus suitable for use on performing one step in the process of the invention.
FIGURES 3–5 are sectional views, not necessarily to scale, showing a semiconductive device in successive stages of fabrication by the process represented in FIGURE 1.

As indicated in FIGURE 1, in accordance with the invention in one form there is provided a wire or similar lead member which contains the activator impurity substance which is to be dispersed in the semiconductor. In the present example this impurity is an acceptor-type impurity constituting a minor alloy constituent of the lead wire which when dispersed in a semiconductor will tend to give it strongly P-type conduction characteristics. A silver wire containing about 1% by weight of aluminum as the activator impurity is suitable. The wire is typically a few mils in diameter and exhibits the mechanical properties of strength and flexibility required for a transistor lead. Such a wire may readily be provided by ordinary drawing from a mass of alloy material consisting primarily of the principal constituent of the wire and containing a minor amount of the impurity substance. Conventional annealing and redrawing may be employed where necessary to retain strength and to avoid any brittleness of the wire which the presence of the impurity may tend to produce. Such methods of wire fabrication are well known in the art and need not be described in detail herein.

As indicated in FIGURE 1 the end of the wire is next plated with a molten solder material which dissolves some of the wire material and thereby introduces the impurity of the wire into the molten solder. The solder material is chosen not only for convenience in electroplating and dissolving of the wire material but also so as to provide suitable dissolution and recrystallization of the semiconductive material during its subsequent alloying with the semiconductive body. In the present example a suitable solder material is indium.

To electroplate the solder material onto the end of the wire the arrangement shown in FIGURE 2 may be used. The wire 10 is held by any suitable means with its end in an electroplating bath 12 which also contains an anode 14, which may be a pure carbon rod. When switch 15 is closed a battery 16 maintains the wire 10 negative with respect to the anode 14 to produce electroplating of molten metal upon the end of the wire. As described in U.S. Patent No. 2,818,375 of George L. Schnable for Method of Forming and Attaching Solder, filed May 23, 1955, and issued December 31, 1957, the plating process can readily be controlled so that the molten deposit forms a globule 17 at the end of wire 10 of the general shape shown. The switch 15 is then opened, the end of the whisker removed from the bath and the globule allowed to solidify.

In the present example suitable electroplating conditions are as follows. The electroplating bath consists of 12% $InCl_3$, 8% $NH_4Cl$ and 80% glycerol by weight. The battery supply potential is about 18 volts, producing a current density at the cathode of about 25 to 50 amperes/cm.$^2$, and the switch 15 is closed for about 3 or 4 seconds to produce a deposit of about 15 micrograms of indium at the end of the wire 10. Typically the wire 10 is 2 mils in diameter and the resultant globule 17 is about 6 mils wide and 8 mils long. During plating the temperature at the cathode (the immersed end of wire 10) is above the melting point of indium, a temperature of about 165° C. being typical. Due to the high current density at the cathode, the cathode temperature is about 20° C. higher than the average temperature of the bath as a whole, and therefore the average temperature in the bath is maintained at about 145° C. by any conventional means, such as a heater coil 18 surrounding the bath.

The globule 17 contains a small trace of the dopant impurity from wire 10, due to partial dissolution of the plated end of the wire by the molten indium plated thereon. The amount of impurity thus introduced into the globule generally increases with the cathode temperature, the time that the molten solder is in contact with the wire and the solubility of the principal wire component and the activator substance in the plated material, and for given wire and solder materials at a given temperature approaches an equilibrium value as the time of contact with the solder material is increased. In the present example under the specific conditions described about 5% of silver and 0.05% of aluminum will be present in the solidified globule.

The solder-plated end of the wire 10 is next applied to the metal emitter dot of a transistor structure and soldered thereto in such a way that the solder melts and dissolves the emitter dot and some of the underlying semiconductor to form a molten agglomerate. This agglomerate later is solidified to form a recrystallized region of semiconductor in which some of the dopant impurity is dispersed and to bond the end of the wire to the semiconductor. The steps employed for this purpose may be similar to those employed in the micro-alloy process described in detail in the above-cited patents of Williams and of Rittmann.

In the example illustrated in FIGURE 3 the wafer 20 of semiconductive material having opposed pits 22 and 24 and bearing opposed adherent emitter and collector dots 25 and 26 respectively and ohmically-soldered base tab 28 is disposed with the wafer horizontal and the emitter dot 25 facing upwards. The wafer is of single-crystalline N-type germanium of about 2 ohm-centimeter resistivity, the emitter dot 25 is circular, of indium, and about 5 mils in diameter, and the collector dot is also circular, of indium, and has a diameter of about 8 mils. The pits 22 and 24 may be formed and the emitter and collector dots applied by the jet-electrolytic etching and plating method described in the copending application Serial No. 472,824 of J. W. Tiley and R. A. Williams, filed December 3, 1954, entitled Semiconductive Devices and Methods for the Fabrication Thereof, now Patent No. 3,067,114, of common assignee herewith. Typically the thickness of the material between the bottoms of the pits is about 0.2 mil.

The wire 10 bearing the doped globule is positioned and held firmly by any suitable means 29 so that the end of the globule 17 abuts the emitter dot 25 and is concentric therewith, as shown. Next the globule 17 is heated sufficiently momentarily to melt it and to dissolve the emitter dot 25 and a small amount of the underlying semiconductive material of body 20. While the globule 17 is molten it dissolves more of the wire 10. The result is the formation of a molten agglomerate containing germanium and indium together with aluminum which has been dissolved from the wire. The aluminum is in this case introduced by dissolution of the wire both during the original electroplating operation and while the molten agglomerate is in contact with the wire during the soldering operation.

The source of heat is removed as soon as the molten agglomerate has been formed, typically after about 2 seconds, and the agglomerate is allowed to solidify while the wire 10 is held fixed in contact with the agglomerate. During heating the agglomerate typically reaches a temperature of about 300 degrees C. The heating required to melt globule 17 may be provided by any suitable means, such as by direct radiation from a hot source or by application of heat to wire 10. For example as represented in FIGURE 3 the heating may be provided by gripping wire 10 between a pair of metal jaws 30, at least one of which jaws is heated as by passing an electric current through it. Application of heat is then terminated by shutting off the current, and/or by opening the jaws as indicated in FIGURE 4.

Figures 4, 5:
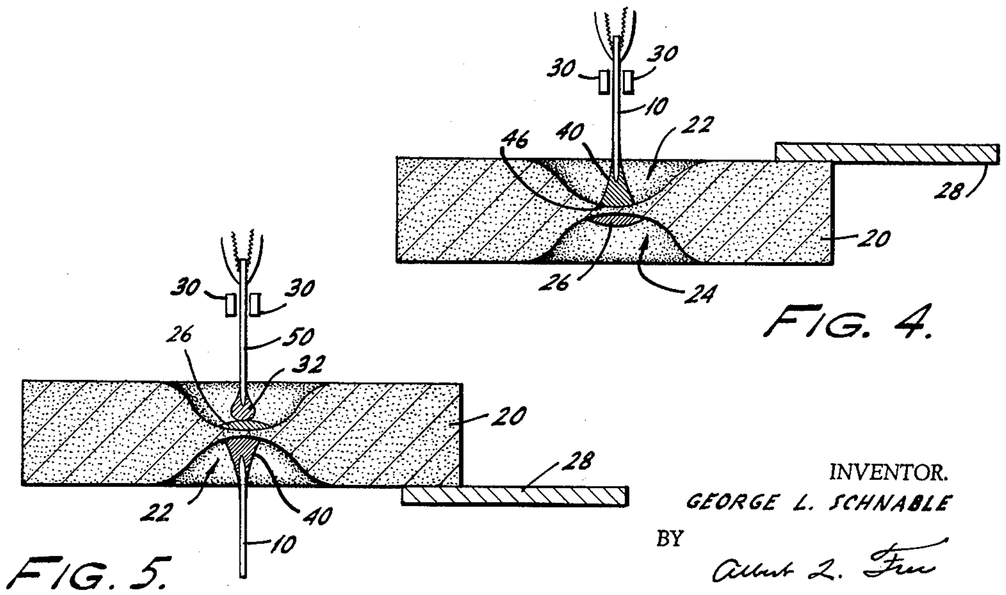

FIGURE 4 illustrates the conditions at the emitter of the transistor after cooling and solidification of the agglomerate. Wire 10 is firmly bonded to the region of the wafer 20 originally underlying emitter dot 25 by the metal fillet 40, consisting principally of indium from the globule and from the emitter dot. In the portion of the semiconductive wafer immediately under the fillet of metal there is an extremely thin recrystallized region 46 in which aluminum has been dispersed to convert the semiconductor to strongly P-type material and to form a rectifying junction of excellent hole-injecting properties at the transition between the P- and N-type regions. The thickness of the P-type region 46 is so small, e.g. less than 0.001 mil, that it does not show in the drawing.

To complete the transistor a collector lead is normally soldered to the collector dot 26. As shown in FIGURE 5 this may be accomplished by turning the wafer so its collector side faces upward and soldering another wire 50 to the collector. In some cases a P–N junction similar to that formed at the emitter may be desired, in which case the wire 50 may be provided at its end with a globule 32 and the globule melted while in contact with the collector dot 26 and subsequently resolidified, in the same general manner described herein with reference to forming the emitter connection. In other cases in which it is preferred that the collector be in the form of a surface-barrier contact instead of an alloy-junction, no dopant impurity is employed. Instead the wire may be of an inactive metal such as silver without doping impurity and the globule may be a solder of indium and tin applied to the end of the wire by the electroplating procedure described in the copending application Serial No. 798,825 of Donald P. Sanders, entitled Semiconductor Device Fabrication, filed March 12, 1959, now Patent No. 3,024,179, of common assignee herewith. The heating in this instance is sufficiently slight that when the globule melts and solders the wire to the collector dot the underlying semiconductor is not dissolved.

After attachment of both emitter and collector leads in this manner the transistor may be cleaned by an electrolytic caustic etch, rinsed, dried, mounted on a suitable stem, baked and sealed in dry air or other inert material in a manner well known in the art. The resultant transistor exhibits values of common-emitter current-gain typically in excess of 20 and is suitable for operation at very high frequencies.

In another preferred embodiment of the invention the process may be applied to fabrication of a micro-alloy drift transistor of the general type described in copending application Serial No. 56,619 of R. A. Williams, entitled Semiconductive Device and Method for the Fabrication Thereof, filed September 1, 1960, now Patent No. 3,096,259, but using cadmium in place of indium as the material of the collector and emitter dots to permit operation at higher temperatures as described in my copending application Serial No. 829,436, entitled Semiconductor Devices and Methods of Fabricating Them, filed July 24, 1959, now Patent No. 3,005,735. In this example of the invention the wire lead is composed entirely of the dopant material aluminum, and the plated globule is of tin-zinc electroplated onto the end of the aluminum wire from the following bath:

| | Percent by weight |
|---|---|
| Glycerine | 73.1 |
| Stannous chloride | 16.1 |
| Zinc chloride | 3.43 |
| Ammonium chloride | 7.31 |
| Dodecylbenzene sodium sulfonate | 0.02 |

The voltage supplied between wire cathode and carbon anode is about 20 volts, the temperature of the bath remote from the cathode is about 155° C., the temperature at the cathode is at least about 200° C. and the time of plating about 1.4 seconds to produce a tin-zinc globule which is about 9% zinc by weight. The wire bearing the tin-zinc globule may then be soldered to the cadmium emitter dot in the same general manner described hereinbefore in connection with the fabrication of the indium PNP transistor. The collector lead wire may be attached with tin-cadmium solder containing 20% cadmium by weight.

It will be understood that in accordance with the invention the impurity substance is dispersed into the semiconductor by dissolving it from the impurity-carrying wire into an agglomerate which in molten form is maintained in contact with the semiconductor, and that there are a large variety of specific steps by which this may be accomplished in different applications. For example, the dissolving of the wire material may be accomplished in either or both of the steps of applying the solder to the wire and soldering the wire to the semiconductive body. As described hereinbefore the lead member employed, which is preferably a wire but which may have any convenient shape, may be entirely of the impurity substance or it may bear the impurity substance as a constituent in alloy form. In other cases the impurity may be present in the wire in solid solution. Furthermore since normally only the outer portion of the lead member is dissolved the wire may consist of a mechanically suitable core clad with an external layer of a dopant-carrying substance, such as a layer of nickel containing phosphorus where a donor-type impurity is desired.

In general the material of the lead member should have a melting point above the temperatures used in the process, a substantial solubility in the solder metal at least at some of the temperatures produced while in contact with the solder metal, satisfactory mechanical qualities and the ability to form reproducible alloys or solid solutions with the dopant material. In addition to the pure aluminum and the silver-aluminum wires mentioned before, other examples of materials which may be employed in the lead member in various applications are alloys or solid solutions of the dopant material with gold, nickel, platinum, copper, palladium, rhodium, iridium, ruthenium or cobalt. Among the possible dopant impurities besides aluminum and phosphorus for use in the wire are boron, scandium, gallium, arsenic and antimony.

The solder material used preferably has a relatively low melting point—below the melting point of the lead member and, in cases in which it is electroplated, below the maximum operating temperature at the cathode. It should also have the ability to dissolve a substantial amount of the principal material of the lead member and of the activator substance at a temperature produced in the process. Among the usable solder materials, in addition to the indium and tin-zinc mentioned hereinbefore, are cadmium-indium, cadmium-zinc, tin-indium, bismuth-tin, bismuth-cadmium, bismuth-lead, tin-lead, lead-cadmium, cadmium-tin, tin-thallium, indium-silver, tin-gold, lead-gold and bismuth-gold.

It will also be understood that the invention is not limited to use in making rectifying connections in transistors but may be used in any of a large variety of applications in which dispersal of an activating impurity substance into a semiconductive body and bonding of a connection thereto is desired. Such other applications include for example making non-rectifying connections by using an activator impurity substance which tends to produce the same conductivity-type as originally exists in the semiconductive body. In such cases, and in any case in which the alloyed region need not be formed with the greatest possible precision, the solder substance may be melted in direct contact with the semiconductor without using an intervening metallic deposit on the semiconductor.

Accordingly while the invention has been described with particular reference to specific embodiments thereof it will be understood that it may be embodied in any of a large variety of different forms without departing from the scope of the invention as defined by the following claims.

I claim:

1. A method for introducing an activator impurity substance into a portion of a body of crystalline semiconductive material and for bonding a lead member to said body portion, comprising depositing in molten form a first mass of solder material upon a portion of a metal lead member containing said impurity substance, said deposited molten solder material being maintained during said deposition at a temperature below the melting point of said member but sufficiently high that said deposited molten material dissolves a quantity of said impurity substance from said metal lead member during said deposition, and then cooling said first mass to cause it to solidify and adhere to said portion of said metal lead member, said deposition step and said cooling step being performed while both said solder material and said metal lead member are out of contact with said semiconductive body; then positioning said metal lead member so that said solidified material thereon bears against said portion of said semiconductive body, melting said solidified material while it is so positioned to form a second mass of molten material comprising said solder material, said impurity substance dissolved therein and some of said semiconductive material of said body portion, said lead member being maintained at a temperature below its melting point during said melting, and cooling said second mass while holding said lead member therewithin, thereby to recrystallize said body portion and bond said lead member thereto.

2. A process according to claim 1, wherein said step of melting said solidified material comprises heating said solidified material to a sufficiently high temperature for a sufficiently long time to dissolve an additional quantity of said impurity substance contained in said lead member into said second mass of molten material.

3. A process according to claim 1, wherein said step of depositing in molten form said first mass of said solder material upon said portion of said metal lead member comprises electroplating said solder material in molten form onto an end of said metal lead member.

4. A method for introducing an activator impurity substance into a portion of a body of crystalline semiconductive material and for bonding a lead member to said body portion, comprising depositing in molten form a first mass of solder material upon a portion of a metal lead member containing said impurity substance, said deposited molten solder material being maintained during said deposition at a temperature below the melting point of said member but sufficiently high that said deposited molten material dissolevs a quantity of said impurity substance from said metal lead member during said deposition, and then cooling said first mass to cause it to solidify and adhere to said portion of said metal lead member, said deposition step and said cooling step being performed while both said solder material and said metal lead member are out of contact with said semiconductive body, applying to said portion of said semiconductive body an adherent solid metal deposit soluble in said solder material when the latter is molten, then positioning said lead member so that said solidified material thereon bears against said solid metal deposit, melting said solidified material while it is so positioned to form a second mass of molten material comprising said solder material, said impurity substance dissolved therein, said metal deposit and some of said semiconductive material of said body portion, said lead member being maintained at a temperature below its melting point during said melting, and cooling said second mass while holding said lead member therewithin, thereby to recrystallize said body portion and bond said lead member thereto.

5. A method according to claim 4, wherein said step of forming said first mass of molten solder material upon said metal lead member comprises electroplating said solder material in molten form onto an end of said metal lead member.

6. A process according to claim 4, wherein said step of melting said solidified material comprises heating said solidified material to a sufficiently high temperature for a sufficiently long time to dissolve an additional quantity of said impurity substance in said lead member into said second mass of molten material.

7. A process according to claim 4, wherein said step of depositing in molten form said first mass of solder material upon said portion of said metal lead member comprises electroplating said solder material in molten form onto an end of said metal lead member, said step of applying said adherent solid metal deposit to said body portion comprises electroplating said deposit thereonto, and said step of melting said solidified material comprises heating said solidified material to a sufficiently high temperature for a sufficiently long time to dissolve an additional quantity of said impurity substance in said lead member into said second mass of molten material.

8. A method according to claim 4, in which said metal lead member contains aluminum as an activator impurity.

9. A method according to claim 4, in which said metal lead member consists primarily of silver and secondarily of aluminum.

10. A method according to claim 4, in which said metal lead consists essentially of aluminum.

11. A method according to claim 4, in which said metal lead member contains aluminum as an activator impurity and said solder material consists essentially of indium.

References Cited in the file of this patent

UNITED STATES PATENTS

| | | |
|---|---|---|
| 2,856,320 | Swanson | Oct. 14, 1958 |
| 2,930,108 | Williams | Mar. 29, 1960 |
| 2,942,166 | Michlin | June 21, 1960 |
| 2,952,824 | Pearson | Sept. 13, 1960 |
| 3,005,735 | Schnable | Oct. 24, 1961 |

FOREIGN PATENTS

| | | |
|---|---|---|
| 1,231,538 | France | Sept. 29, 1960 |

OTHER REFERENCES

Hansen: Constitution of Binary Alloys, 2nd ed., N.Y., McGraw-Hill, 1958. Page 186.